US012696541B2

(12) United States Patent
Lee et al.

(10) Patent No.: US 12,696,541 B2
(45) Date of Patent: Jul. 28, 2026

(54) DISPLAY DEVICE INCLUDING MAIN AND REDUNDANCY LIGHT EMITTING DIODES

(71) Applicant: LG Display Co., Ltd., Seoul (KR)

(72) Inventors: Chang Ho Lee, Paju-si (KR); Hye Ran Jeong, Goyang-si (KR); Sun Geun Bae, Paju-si (KR); Hyo Seob Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 538 days.

(21) Appl. No.: 17/778,378

(22) PCT Filed: Mar. 30, 2020

(86) PCT No.: PCT/KR2020/004349
§ 371 (c)(1),
(2) Date: May 19, 2022

(87) PCT Pub. No.: WO2021/100983
PCT Pub. Date: May 27, 2021

(65) Prior Publication Data
US 2023/0005962 A1 Jan. 5, 2023

(30) Foreign Application Priority Data

Nov. 22, 2019 (KR) ........................ 10-2019-0151388

(51) Int. Cl.
*H10D 86/60* (2025.01)
*H10D 86/40* (2025.01)
(Continued)

(52) U.S. Cl.
CPC ........... *H10D 86/60* (2025.01); *H10D 86/441* (2025.01); *H10W 90/00* (2026.01); *H10W 70/60* (2026.01);
(Continued)

(58) Field of Classification Search
CPC ....... H01L 27/124; H01L 24/24; H01L 24/73; H01L 25/167; H01L 24/29; H01L 24/32;
(Continued)

(56) References Cited

U.S. PATENT DOCUMENTS

| | | |
|---|---|---|
| 11,201,199 B2 | 12/2021 | Nam et al. |
| 2012/0049219 A1 | 3/2012 | Kamiya et al. |

(Continued)

FOREIGN PATENT DOCUMENTS

| | | |
|---|---|---|
| CN | 106816547 A | 6/2017 |
| CN | 108267903 A | 7/2018 |

(Continued)

OTHER PUBLICATIONS

English translation of KR_101997625 (Year: 2019).*
English translation of KR 100671327 (Year: 2007).*

*Primary Examiner* — Brian Turner
*Assistant Examiner* — Zhijun Xu
(74) *Attorney, Agent, or Firm* — Seed Intellectual Property Law Group LLP

(57) ABSTRACT

A display device includes a substrate on which a plurality of light emitting elements are disposed. A plurality of lines are disposed on an upper surface of the substrate. A plurality of upper pads are disposed on the upper surface of the substrate and electrically connected to the plurality of lines. A plurality of link lines are disposed on a lower surface of the substrate. A plurality of lower pads are disposed on the lower surface of the substrate and electrically connected to the plurality of link lines. A plurality of side lines electrically connect the plurality of upper pads and the plurality of lower pads. The plurality of side lines include a plurality of first side lines and a plurality of second side lines, and the plurality of first side lines and the plurality of second side lines are disposed on different layers.

23 Claims, 8 Drawing Sheets

(51) Int. Cl.

| | |
|---|---|
| *H10W 70/60* | (2026.01) |
| *H10W 70/652* | (2026.01) |
| *H10W 72/00* | (2026.01) |
| *H10W 72/30* | (2026.01) |
| *H10W 90/00* | (2026.01) |
| *H10W 90/22* | (2026.01) |

(52) U.S. Cl.
CPC .. *H10W 70/6528* (2026.01); *H10W 72/07353* (2026.01); *H10W 72/07354* (2026.01); *H10W 72/30* (2026.01); *H10W 72/334* (2026.01); *H10W 72/347* (2026.01); *H10W 72/874* (2026.01); *H10W 90/22* (2026.01); *H10W 90/732* (2026.01); *H10W 90/734* (2026.01)

(58) Field of Classification Search
CPC ........... H01L 24/33; H01L 2224/24051; H01L 2224/24146; H01L 2224/24147; H01L 2224/24227; H01L 2224/244; H01L 2224/2518; H01L 2224/32058; H01L 2224/32145; H01L 2224/32225; H01L 2224/33181; H01L 2224/73267; H01L 2924/12041; H01L 2924/1426; H01L 33/62; H01L 25/0753; H01L 27/156; H01L 21/28017; H01L 21/76895; H10D 86/60; H10D 86/441; H10D 64/01302; H10W 90/00; H10W 70/60; H10W 70/6528; H10W 72/07353; H10W 72/07354; H10W 72/30; H10W 72/334; H10W 72/347; H10W 72/874; H10W 90/22; H10W 90/732; H10W 90/734; H10W 20/0698; H10H 20/857; H10H 29/142

See application file for complete search history.

(56) References Cited

U.S. PATENT DOCUMENTS

| | | | |
|---|---|---|---|
| 2018/0062047 A1 | 3/2018 | Biwa et al. | |
| 2018/0188579 A1* | 7/2018 | Jeong | G02F 1/133345 |
| 2019/0172760 A1* | 6/2019 | Hsiang | H01L 22/22 |
| 2019/0385944 A1* | 12/2019 | Wang | H01L 23/528 |
| 2020/0135126 A1* | 4/2020 | Yokoyama | G09G 3/3648 |
| 2021/0082884 A1 | 3/2021 | Schwarz | |

FOREIGN PATENT DOCUMENTS

| | | | | |
|---|---|---|---|---|
| DE | 102018101090 A1 | | 7/2019 | |
| EP | 3343273 B1 | | 2/2020 | |
| EP | 3633658 A1 | | 4/2020 | |
| KR | 100671327 B1 * | | 1/2007 | G09F 9/33 |
| KR | 10-2017-0133347 A | | 12/2017 | |
| KR | 10-2019-0044016 A | | 4/2019 | |
| KR | 10-2019-0051629 A | | 5/2019 | |
| KR | 20190070038 A | | 6/2019 | |
| KR | 101997625 * | | 7/2019 | |
| KR | 20210052894 A | | 5/2021 | |
| KR | 102495537 B1 | | 2/2023 | |
| KR | 102582066 B1 | | 9/2023 | |
| KR | 102640288 B1 | | 2/2024 | |
| TW | 1666490 B * | | 7/2019 | |
| WO | 2019/167966 A1 | | 9/2019 | |

* cited by examiner

DISPLAY DEVICE INCLUDING MAIN AND REDUNDANCY LIGHT EMITTING DIODES

BACKGROUND

Technical Field

The present disclosure relates to a display device, and more particularly, to a display device capable of securing an arrangement space of side lines and preventing a migration phenomenon in the side lines.

Description of the Related Art

Liquid crystal display devices (LCDs) and organic light emitting display devices (OLEDs), which have been widely used up to now, are gradually expanding their application ranges.

Liquid crystal display devices and organic light emitting display devices are widely applied to screens of usual electronic devices, such as mobile phones and laptop computers or the like, due to the advantages of being able to provide high resolution screens and allowing for thinning and weight reduction thereof, and an application range of the display devices is also gradually expanding.

However, in liquid crystal display devices and organic light emitting display devices, there is a limitation in reducing a size of a bezel area visible to a user, which is an area where an image is not displayed in the display device. For example, in the case of a liquid crystal display device, since a sealant needs to be used to seal liquid crystals and bond upper and lower substrates, there is a limit to reducing the size of the bezel area. In addition, in the case of an organic light emitting display device, since an organic light emitting element is formed of an organic material and is very vulnerable to moisture or oxygen, it is beneficial to dispose an encapsulation for protecting the organic light emitting element, so there is a limit to reducing the size of the bezel area. In particular, since there are challenges in implementing an extra-large screen as a single panel, when a plurality of liquid crystal display panels or a plurality of organic light emitting display panels are disposed in a type of tile shape to thereby implement an extra-large screen, a problem in which bezel areas between adjacent panels are visible by a user can be caused.

BRIEF SUMMARY

As an alternative to the above approach in the related art, a display device including light emitting diodes (LEDs) has been proposed. Since the LED is formed of an inorganic material rather than an organic material, it has excellent reliability and has a longer lifespan compared to a liquid crystal display device or an organic light emitting display device. In addition, the LED is an element that is suitable for being applied to an extra-large screen because it has not only a fast-lighting speed, but also has low power consumption and excellent stability due to strong impact resistance, and can display high luminance images.

Accordingly, LED elements may be used in a display device for providing an extra-large screen capable of reducing or minimizing a bezel area in accordance with one or more embodiments of the present disclosure.

The inventors of the present disclosure have further recognized that since LEDs have better luminous efficiency compared to organic light emitting elements, in the case of a display device including LEDs compared to a display device using organic light emitting elements, a size of one pixel, that is, a size of a light emitting area to emit light of the same luminance is very small. Accordingly, the inventors of the present disclosure have recognized that, when a display device is implemented using LEDs, a distance between light emitting areas of adjacent pixels is much greater than a distance between light emitting areas of adjacent pixels in an organic display device having the same resolution. Accordingly, the inventors of the present disclosure have recognized that, when a tiling display is implemented by disposing a plurality of display panels in the form of tiles, since an interval between LEDs disposed at an outermost portion of a display panel and LEDs disposed at an outermost portion of the other display panel adjacent thereto can be implemented to be identical to an interval between LEDs disposed in one display panel, it is possible to implement a zero bezel in which there is substantially no bezel area. However, as described above, in order to implement an interval between LEDs disposed at an outermost portion of a display panel and LEDs disposed at an outermost portion of the other display panel adjacent thereto to be identical to an interval between LEDs disposed in one display panel, it is beneficial to position various drivers such as a gate driver and a data driver, which were previously positioned on an upper surface of the display panel, on a lower surface instead of the upper surface of the display panel.

Accordingly, the inventors of the present disclosure have invented a display device having a new structure in which elements such as a thin film transistor and LEDs are disposed on an upper surface of the display panel and drivers such as a gate driver and a data driver are disposed on a lower surface of the display panel. In addition, the inventors of the present disclosure have invented a manufacturing technique of forming side lines on a side surface of the display panel to connect the elements disposed on the upper surface of the display panel and the drivers disposed on the lower surface of the display panel. Specifically, the side lines were formed on the display panel using a printing pad. Accordingly, by performing printing a plurality of times using a small-sized printing pad, side lines can be formed on a large-area display panel without limiting a size of the display panel.

However, the inventors of the present disclosure have recognized that a line design space became a problem in display devices having the structure as described above. A technology of forming side lines using a printing pad as described above, is a method of printing side lines using a printing pad, after forming intaglio patterns etched in a metal plate mold, filling a conductive paste in the intaglio patterns, and after the filled conductive paste is applied on the printing pad, the side lines are printed using the printing pad. However, in performing an etching process using a photoresist to form the intaglio patterns, there was a problem in that a gap between the intaglio patterns may not be excessively narrowed due to a process margin of the etching process. In addition, when the gap between the intaglio patterns is reduced to several micrometers using a maximum margin, there could be a problem in which the conductive paste may not be properly filled in the intaglio patterns or the conductive paste may remain in the intaglio patterns. Accordingly, it is beneficial to secure a gap between the intaglio patterns for process stability, for example, to secure a gap of about 50 $\mu$m or more.

In addition, the number of light emitting elements that are disposed per unit area of a display device has increased as a need for a high resolution display panel. Accordingly, the number of lines for transmitting a signal to the light emitting elements has also increased. Accordingly, whereas the number of lines to be disposed in a predetermined space increases, there is a limit in reducing an interval between side lines.

Meanwhile, the inventors of the present disclosure have recognized a problem that a migration phenomenon may occur between side lines adjacent to each other. The migration phenomenon is a phenomenon in which when moisture is present and a potential difference exists between two adjacent electrodes or lines, metallic ions move from one electrode or line to another electrode or line by an electrochemical reaction, so that two electrodes or lines adjacent to each other are electrically connected. That is, when a potential difference is formed between side lines adjacent to each other for a long period of time in a process of driving a display device, there may occur a problem in which metallic ions constituting the side lines move from one side line to the other side line, and the side lines adjacent to each other are electrically connected to each other. In particular, as the resolution of the display device is higher, since the number of side lines to be disposed increases and an interval between the side lines also decreases, the migration problem as described above may be severed.

Accordingly, the inventors of the present disclosure have invented a display device having a new structure capable of increasing the number of side lines that can be disposed in a predetermined space and securing an interval between the side lines.

Accordingly, one or more embodiments of the present disclosure provide a display device capable of increasing the number of side lines disposed in a limited space by disposing side lines in a two-layer structure.

In addition, one or more embodiments of the present disclosure provide a display device in which side lines are disposed on different layers, so that an interval between the lines can be increased.

In addition, one or more embodiments of the present disclosure provide a display device capable of extending a line width of side lines disposed on a display device.

The technical benefits of the present disclosure are not limited to the above-mentioned benefits, and other benefits, which are not mentioned above, can be clearly understood by those skilled in the art from the following descriptions.

A display device according to an embodiment of the present disclosure includes a substrate on which a plurality of light emitting elements are disposed; a plurality of lines disposed on an upper surface of the substrate; a plurality of link lines disposed on a lower surface of the substrate; and a plurality of side lines connecting the plurality of lines and the plurality of link lines, wherein the plurality of side lines include a plurality of first side lines and a plurality of second side lines, wherein the plurality of first side lines and the plurality of second side lines are disposed on different layers.

A display device according to an embodiment of the present disclosure includes a substrate on which a plurality of light emitting elements are disposed; a plurality of first lines and a plurality of second lines disposed on an upper surface of the substrate; a plurality of first upper pads and a plurality of second upper pads disposed on the upper surface of the substrate and connected to the plurality of first lines and the plurality of second lines; a plurality of first link lines and a plurality of second link lines disposed on a lower surface of the substrate; a plurality of first lower pads and a plurality of second lower pads disposed on the lower surface of the substrate and connected to the plurality of first link lines and the plurality of second link lines; a plurality of first side lines connecting the plurality of first upper pads and the plurality of first lower pads; a first insulating layer disposed to cover the plurality of first side lines; and a plurality of second side lines connecting the plurality of second upper pads and the plurality of second lower pads and disposed on the first insulating layer.

Other detailed matters of the embodiments are included in the detailed description and the drawings.

According to the present disclosure, the number of side lines can be increased by disposing the side lines on different layers.

According to the present disclosure, an interval between the side lines can be increased, and a migration phenomenon that may occur in the side lines can be prevented by disposing the side lines on different layers.

According to the present disclosure, a voltage drop that may occur in a display device can be reduced by increasing a width of the side line.

Effects according to the present disclosure are not limited by the contents exemplified above, and more various effects are included in the present disclosure.

DETAILED DESCRIPTION

Figure 1:
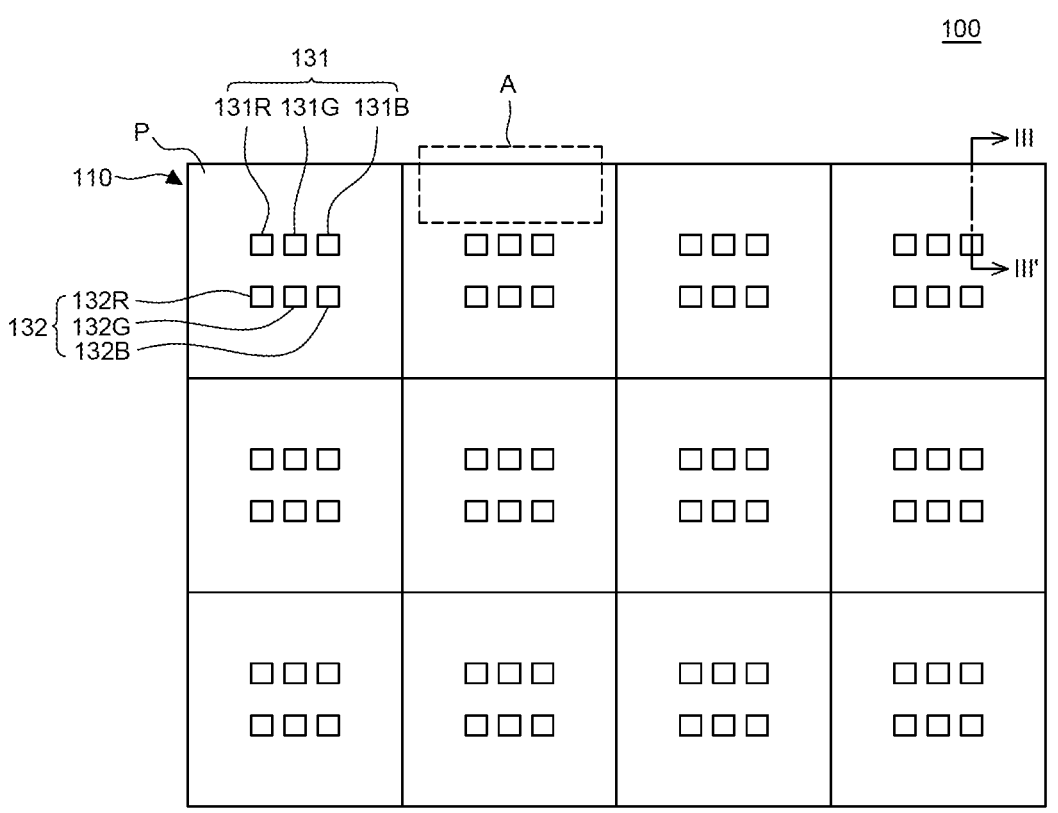
FIG. 1 is a schematic top view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" the other element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated even though the dimensions including the size and thickness of the components illustrated in the drawings are drawn to scale with respect to at least one actual working embodiment of the present disclosure.

The features of various embodiments of the present disclosure can be partially or entirely bonded to or combined with each other and can be interlocked and operated in technically various ways, and the embodiments can be carried out independently of or in association with each other.

Hereinafter, various embodiments of the present disclosure will be described in detail with reference to accompanying drawings.

FIG. 1 is a schematic top view of a display device according to an embodiment of the present disclosure.

Referring to FIG. 1, LEDs 130 functioning as light emitting elements are disposed in each of unit pixels P of a display device 100. Although it has been described herein that the LED 130 is used as a light emitting element, the present disclosure is not limited thereto, and an organic light emitting element, a quantum dot element, and the like may also be used.

The LEDs 130 include first LEDs 131 and second LEDs 132. The first LEDs 131 and the second LEDs 132 are disposed in lines within the unit pixel P of the substrate 110, and the first LEDs 131 and the second LEDs 132 are disposed adjacent to each other.

The first LEDs 131 are disposed in a first row of the unit pixel P. The first LEDs 131 are configured of elements emitting light of different colors. For example, the first LEDs 131 include a first red LED 131R, a first green LED 131G, and a first blue LED 131B.

The second LEDs 132 are disposed in a second row of the unit pixel P. The second LEDs 132 are configured of elements emitting light of the same colors as the first LEDs 131. For example, the second LEDs 132 include a second red LED 132R, a second green LED 132G, and a second blue LED 132B. However, the present disclosure is not limited thereto, and the first LEDs 131 and the second LEDs 132 may further include a white LED for implementing a white sub-pixel. In addition, types and the number of LEDs constituting the first LEDs 131 and the second LEDs 132 may be variously configured according to embodiments.

The plurality of LEDs 130 disposed in the display device 100 may be spaced apart from each other at different intervals. For example, the plurality of unit pixels P include a plurality of first LEDs 131 and a plurality of second LEDs 132 that are disposed in two lines side by side, and in each unit pixel P, the first LEDs 131 and the second LEDs 132 are spaced apart at the same interval. However, an interval between the first LEDs 131 and the second LEDs 132 that are disposed while having a boundary of the unit pixels P may be different from the interval between the first LEDs 131 and the second LEDs 132 disposed within the unit pixel P. However, it is not limited thereto, and each of the first LEDs 131 and the second LEDs 132 may be disposed at the same interval from each other in an entire area of the display device 100.

The plurality of first LEDs 131 and the plurality of second LEDs 132 may be driven by different thin film transistors. In addition, among the plurality of first LEDs 131 and the plurality of second LEDs 132, the first LEDs 131 and the second LEDs 132 that emit light of the same color may be driven by different gate lines and data lines.

The first LEDs 131 may be main LEDs, and the second LEDs 132 may be redundancy LEDs. That is, the second LED 132 operates when a defect occurs in the first LED 131 of a specific unit pixel to thereby improve reliability of the display device 100. However, the present disclosure is not limited thereto, and both the first LED 131 and the second LED 132 of the light emitting display device 100 may be main LEDs that emit light while displaying an image.

Meanwhile, when a tiling display is implemented using the display device 100 according to an embodiment of the present disclosure, since an interval between outermost LEDs 130 of one display panel and outermost LEDs 130 of another display panel adjacent thereto may be implemented to be identical to the interval between the LEDs 130 in one display panel, it is possible to implement a zero bezel in which there is substantially no bezel area. Accordingly, it may be described that the display device 100 is defined as having only a display area and a non-display area is not defined in the display device 100.

Figure 2:
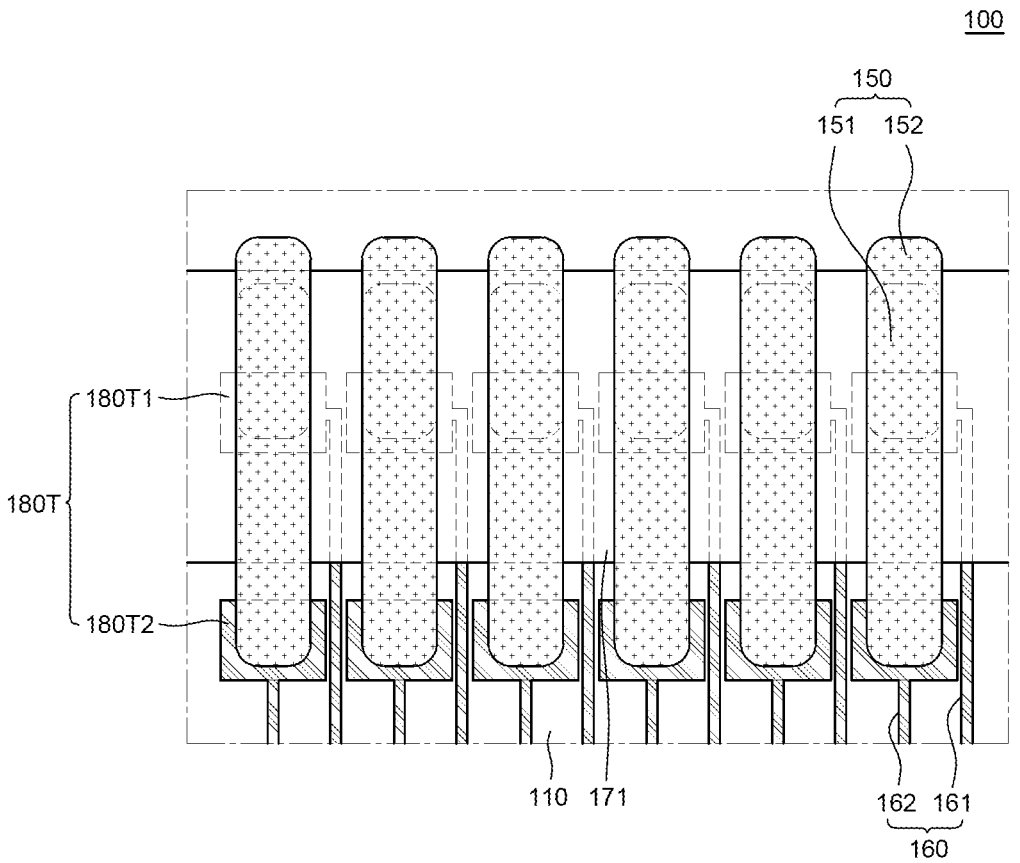
FIG. 2 is a schematic enlarged plan view of area A of FIG. 1.
Figure 3:
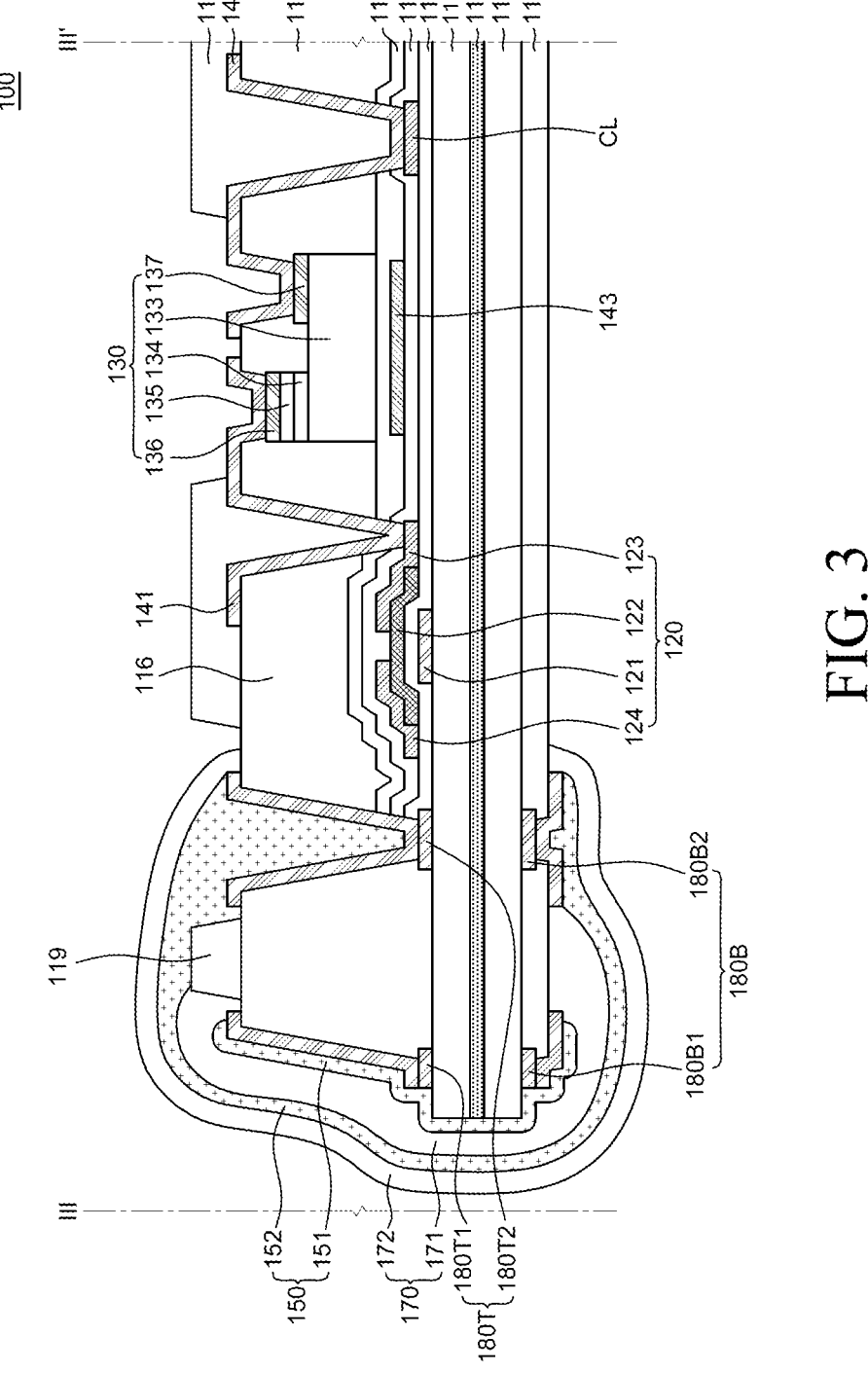
FIG. 3 is a cross-sectional view taken along line of FIG. 1.

FIG. 2 is a schematic enlarged plan view of area A of FIG. 1. FIG. 3 is a cross-sectional view taken along line of FIG. 1. Referring to FIGS. 2 and 3, the display device 100 includes a substrate 110, the LEDs 130, a thin film transistor 120, a plurality of pads 180 (e.g., upper pads 180T, lower pads 180B), a plurality of lines 160, a plurality of link lines, a plurality of insulating layers, and a plurality of side lines 150. In FIG. 2, only upper pads 180T, the lines 160, the substrate 110, a first insulating layer 171, and the side lines 150 are illustrated among various components of the display device 100 for convenience of illustration.

First, referring to FIG. 3, the substrate 110 includes a first substrate 111 and a second substrate 112. The first substrate 111 is a substrate that supports components disposed in an upper portion of the display device 100, and may be an insulating substrate. For example, the first substrate 111 may be formed of glass or resin or the like. Also, the first substrate 111 may be formed to include a polymer or plastic. In some embodiments, the first substrate 111 may be formed of a plastic material having flexibility. Also, although the substrate 110 is described as a structure including two substrates in FIG. 3, the present disclosure is not limited thereto, and the substrate 110 may be configured as a single substrate.

The LED 130, the upper pads 180T, the lines 160, and the thin film transistor 120 are disposed on the first substrate 111. Hereinafter, the display device 100 is described as a top emission type display device, but is not limited thereto.

Referring to FIG. 3, the thin film transistor 120 is disposed on the first substrate 111. The thin film transistor 120 is illustrated as a thin film transistor having a bottom gate structure in which a gate electrode 121 is disposed at a lowermost portion, an active layer 122 is disposed on the gate electrode 121, and a source electrode 123 and a drain-electrode 124 are disposed on the active layer 122, but it is not limited thereto.

A passivation layer 114 for protecting the thin film transistor 120 is disposed on the source electrode 123 and the drain-electrode 124. However, the passivation layer 114 may be omitted in some embodiments.

A common line CL is disposed on a gate insulating layer 113. The common line CL is a line for applying a common voltage to the LED 130 and may be disposed to be spaced apart from the gate line or the data line. The common line CL may be formed of the same material as the source electrode 123 and the drain-electrode 124 or the plurality of lines, but is not limited thereto.

A reflective layer 143 is disposed on the passivation layer 114 in the display area. The reflective layer 143 is a layer for reflecting light that is emitted toward the first substrate 111 among light that is emitted from the LED 130, upwardly of the display device 100, to thereby emit the light to the outside of the display device 100. The reflective layer 143 may be formed of a metallic material having high reflectivity.

An adhesive layer 115 is disposed on the reflective layer 143. The adhesive layer 115 is an adhesive layer 115 for bonding the LED 130 on the reflective layer 143, and may insulate the reflective layer 143 formed of a metallic material from the LED 130. The adhesive layer 115 may be formed of a heat-curable material or a light-curable material, but is not limited thereto.

The LED 130 is disposed on the adhesive layer 115. The LED 130 includes an n-type layer 133, an active layer 134, a p-type layer 135, an n-electrode 137, and a p-electrode 136. In FIG. 3, an LED having a lateral structure is illustrated as the LED 130, but the structure of the LED 130 is not limited thereto.

The n-type layer 133 is disposed at a lower portion of the LED 130. The n-type layer 133 is a layer for supplying electrons to the active layer 134 and may be formed by implanting n-type impurities into gallium nitride (GaN), but is not limited thereto.

The active layer 134 is disposed on the n-type layer 133. The active layer 134 is a light emitting layer that emits light by combining electrons and holes, and may be formed of a nitride semiconductor, for example, indium gallium nitride (InGaN).

The p-type layer 135 is disposed on the active layer 134. The p-type layer 135 is a layer for injecting holes into the active layer 134 and may be formed by implanting p-type impurities into gallium nitride (GaN), but is not limited thereto.

The n-electrode 137 is disposed on the n-type layer 133. The n-electrode 137 may be formed of indium tin oxide (ITO), indium zinc oxide (IZO), indium tin zinc oxide (ITZO), zinc oxide (ZnO), and tin oxide (TO)-based transparent conductive oxides, but is not limited thereto.

The p-electrode 136 is disposed on the p-type layer 135. The p-electrode 136 may be formed of indium tin oxide (ITO), indium zinc oxide (IZO), indium tin zinc oxide (ITZO), zinc oxide (ZnO), and tin oxide (TO)-based transparent conductive oxides, but is not limited thereto. The p-electrode 136 may be formed of the same material as and simultaneously formed through the same process as the n-electrode 137, for example, a mask process, but is not limited thereto.

A first planarization layer 116 is disposed on the thin film transistor 120. An upper surface of the first planarization layer 116 may have a surface parallel to the first substrate 111 in an area excluding contact holes and an area where the LED 130 is disposed. Accordingly, the first planarization layer 116 may planarize a step that may occur due to components disposed thereunder. In this case, the first planarization layer 116 may be formed such that partial areas of the p-electrode 136 and the n-electrode 137 of the LED 130 are opened.

Meanwhile, the structure of the LED 130 illustrated in FIG. 3 may be a structure applied to both the first LED 131 and the second LED 132.

A first electrode 141 is disposed on the first planarization layer 116. The first electrode 141 may electrically connect the source electrode 123 of the thin film transistor 120 and the p-electrode 136 of the LED 130 through a contact hole formed in the first planarization layer 116, the passivation layer 114, and the adhesive layer 115. However, it is not limited thereto, and the first electrode 141 may be defined to be in contact with the drain-electrode 124 of the thin film transistor 120 according to a type of the thin film transistor 120.

A second electrode 142 is disposed on the first planarization layer 116. The second electrode 142 may electrically connect the common line CL and the n-electrode 137 of the LED 130 through a contact hole formed in the first planarization layer 116, the passivation layer 114, and the adhesive layer 115. In FIG. 3, it is described that the thin film transistor 120 is electrically connected to the p-electrode 136 and the common line CL is electrically connected to the n-electrode 137, but the present disclosure is not limited thereto, and the thin film transistor 120 may be electrically connected to the n-electrode 137 and the common line CL may be electrically connected to the p-electrode 136.

A bank layer 119 is disposed on the first electrode 141, the second electrode 142, and the first planarization layer 116. The bank layer 119 may be formed of an insulating material. In addition, the bank layer 119 may include, for example, a black material capable of blocking light, such as a black pigment, in order to reduce reflection of external light due to components of the display device 100.

The upper pads 180T are disposed on the first substrate 111. The upper pads 180T are pads that are disposed on the substrate 110 among the plurality of pads 180, and the upper pads 180T may be pads that are connected to the side lines 150 and the lines 160 and transmit signals transmitted from the side lines 150 to the lines 160. In a process of forming the thin film transistor 120, the upper pads 180T may be formed simultaneously therewith, and for example, may be formed of the same material as one of components of the thin film transistor 120. Also, the upper pads 180T may be formed of, for example, the same material as the gate electrode 121 of the thin film transistor 120, but is not limited thereto.

The first planarization layer 116 is disposed on the upper pads 180T. The upper surface of the first planarization layer 116 may have a surface parallel to the first substrate 111 in the area excluding contact holes. Accordingly, the first planarization layer 116 may planarize a step that may occur due to components disposed thereunder. In this case, the first planarization layer 116 may be formed such that partial areas of the upper pads 180T are opened.

Referring to FIGS. 2 and 3, the upper pads 180T include first upper pads 180T1 and second upper pads 180T2.

The first upper pad 180T1 may be disposed closer to an outer portion of the substrate 110 than the second upper pad 180T2. The first upper pad 180T1 may be connected to a first side line 151 through the contact hole formed in the first planarization layer 116.

The second upper pad 180T2 may be disposed on the same layer as the first upper pad 180T1. The second upper pad 180T2 may be disposed closer to a center of the substrate 110 than the first upper pad 180T1. That is, the second upper pad 180T2 may be disposed inwardly than the first upper pad 180T1. The second upper pad 180T2 may be connected to a second side line 152 through a contact hole. The second upper pad 180T2 may be formed of the same material as the first upper pad 180T1, but is not limited thereto.

Referring to FIG. 2, the lines 160 are disposed on the first substrate 111. The lines 160 may be lines that are disposed to drive the display device 100. The display device 100 may include various circuits and light emitting elements, and a driver is disposed to drive the various circuits and the light emitting elements. Accordingly, the lines 160 may be lines that are disposed to supply signals applied from the driver to each of the unit pixels P. For example, the lines 160 may be various lines such as a data line, a gate line, a high potential power supply line, a low potential power supply line, a reference voltage line, a light emission signal line, and the like.

The lines 160 may be formed of the same material as and formed on the same layer as a component of the thin film transistor 120. For example, the lines 160 may be formed of the same material as and formed on the same layer as the gate electrode 121 or may be formed of the same material as and formed on the same layer as the source electrode 123 and the drain-electrode 124, but they are not limited thereto. Also, the lines 160 may be formed of the same material as and disposed on the same layer as the upper pads 180T. Also, the lines 160 may be formed integrally with the upper pads 180T.

The lines 160 include first lines 161 and second lines 162. The first line 161 is a line that is connected to the first upper pad 180T1 of the upper pads 180T, and the second line 162 is a line that is connected to the second upper pad 180T2 of the upper pads 180T. The first line 161 and the second line 162 may be formed of the same material and disposed on the same layer, but are not limited thereto, and they may be formed of different materials and disposed on different layers.

The second substrate 112 is a substrate that supports components disposed under the second substrate 112, and may be an insulating substrate. For example, the second substrate 112 may be formed of glass or resin or the like. Also, the second substrate 112 may be formed to include a polymer or plastic. The second substrate 112 may be formed of the same material as the first substrate 111. In some embodiments, the second substrate 112 may be formed of a plastic material having flexibility. A driver, lower pads 180B, and the link lines are disposed on a lower surface of the second substrate 112.

A driver for driving the LED 130 of the display device 100 may be disposed on the lower surface of the second substrate 112. For example, a gate driver, a data driver, a timing controller and the like may be disposed on the lower surface of the second substrate 112, but the present disclosure is not limited thereto. The driver may be directly formed on the lower surface of the second substrate 112, may be disposed on the lower surface of the second substrate 112 in a chip on film (COF) method, or may be disposed on the lower surface of the second substrate 112 in a method in which it is disposed on a printed circuit board (PCB), but is not limited thereto.

The lower pads 180B are disposed on the lower surface of the second substrate 112. The lower pads 180B are pads that are disposed under the substrate 110 among the plurality of pads 180, and the lower pads 180B may be pads that are connected to the side lines 150 and the link lines and transmit signals transmitted from the link lines to the side lines 150.

A second planarization layer 117 is disposed on the lower pads 180B. One surface of the second planarization layer 117 may have a surface parallel to the second substrate 112 in an area excluding contact holes. Accordingly, the second planarization layer 117 may planarize a step that may occur due to components disposed thereunder. In this case, the second planarization layer 117 may be formed such that partial areas of the lower pads 180B are opened.

The lower pads 180B include first lower pads 180B1 and second lower pads 180B2.

The first lower pad 180B1 may be disposed closer to the outer portion of the substrate 110 than the second lower pad 180B2. The first lower pad 180B1 may be connected to the first side line 151 through the contact hole formed in the second planarization layer 117.

The second lower pad 180B2 may be disposed on the same layer as the first lower pad 180B1. The second lower pad 180B2 may be disposed closer to the center of the substrate 110 than the first lower pad 180B1. That is, the second lower pad 180B2 may be disposed inwardly than the first lower pad 180B1. The second lower pad 180B2 may be connected to the second side line 152 through the contact hole. The second lower pad 180B2 may be formed of the same material as the first lower pad 180B1, but is not limited thereto.

The link lines are disposed on the lower surface of the second substrate 112. The link lines may be lines for transmitting signals from the driver to the lines 160. For example, they may be lines that are disposed to supply signals applied from the driver disposed on the lower surface of the second substrate 112 to each of the LEDs 130.

The link lines include first link lines and second link lines.

The first link line is a line that is connected to the first lower pad 180B1 of the lower pads 180B, and the second link line is a line that is connected to the second lower pad 180B2 of the lower pad 180B. The first link line and the second link line may be formed of the same material and disposed on the same layer, but are not limited thereto, and they may be formed of different materials and disposed on different layers.

Referring to FIG. 3, a first bonding layer 118 is disposed between the first substrate 111 and the second substrate 112. The first bonding layer 118 may be in a form of a film for bonding the first substrate 111 and the second substrate 112. The first bonding layer 118 may be formed of a material capable of bonding the first substrate 111 and the second substrate 112 by being cured through various curing methods. The first bonding layer 118 may be disposed throughout an entire area between the first substrate 111 and the second substrate 112, or may be disposed in only a partial area therebetween.

The side lines 150 are disposed on a side surface of the substrate 110. The side lines 150 may connect the link lines disposed on a lower surface of the substrate 110 and the lines 160 disposed on an upper surface of the substrate 110. For example, the side line 150 is connected to the upper pad 180T disposed on an upper surface of the first substrate 111 and the lower pad 180B disposed on the lower surface of the second substrate 112, and may connect the line 160 connected to the upper pad 180T and the link line connected to the lower pad 180B. Accordingly, the side line 150 may allow a signal applied from the driver to be applied to each LED 130.

The side lines 150 may be formed by a method of printing a conductive paste using a printing pad. The side lines 150 may be formed of a material having high electrical conductivity, such as silver (Ag) or copper (Cu). Widths of the side lines 150 may be greater than widths of the lines 160, but are not limited thereto.

The side lines 150 include the first side lines 151 and the second side lines 152.

The first side line 151 is disposed on the upper surface and a side surface of the first substrate 111 and the lower surface and a side surface of the second substrate 112. The first side line 151 may be disposed to be in contact with the first upper pad 180T1 through the contact hole formed in the first planarization layer 116. Also, the first side line 151 may be disposed to be in contact with the first lower pad 180B1 through the contact hole formed in the second planarization layer 117. Accordingly, the first side line 151 may connect the first upper pad 180T1 and the first lower pad 180B1.

The second side line 152 is disposed on the first side line 151. The second side line 152 is disposed to surround the upper surface and the side surface of the first substrate 111 and the lower surface and the side surface of the second substrate 112. The second side line 152 may be disposed to be in contact with the second upper pad 180T2 through the contact hole formed in the first planarization layer 116. Also, the second side line 152 may be disposed to be in contact with the second lower pad 180B2 through the contact hole formed in the second planarization layer 117. Accordingly, the second side line 152 may connect the second upper pad 180T2 and the second lower pad 180B2. In addition, the second side line 152 may overlap the first side line 151, the first upper pad 180T1, the second upper pad 180T2, the first lower pad 180B1, and the second lower pad 180B2.

Meanwhile, insulating layers 170 may be disposed on the side lines 150. The insulating layers 170 are layers for protecting the side lines 150 from the outside and insulating them from the outside. The insulating layers 170 may be formed of an insulating material. In addition, in order to reduce reflection of external light due to the side lines 150, the insulating layers 170 may include, for example, a black material capable of blocking light, such as a black pigment.

The insulating layers 170 includes the first insulating layer 171 and a second insulating layer 172.

The first insulating layer 171 may be disposed on the first side line 151. The first insulating layer 171 may be disposed to surround the first side line 151 to protect the first side line 151. A plurality of first insulating layers 171 may be disposed to surround one first side line 151, or a single first insulating layer 171 may be disposed to surround all of a plurality of first side lines 151.

The second side line 152 may be disposed on the first insulating layer 171, and the second insulating layer 172 may be disposed on the second side line 152. The second insulating layer 172 may be disposed to surround the second side line 152 to protect the second side line 152. A plurality of second insulating layers 172 may be disposed to surround one second side line 152, or a single second insulating layer 172 may be disposed to surround all of a plurality of second side lines 152.

In previous display devices, line design space became a problem. In previous display devices, side lines were formed on a side surface of a display panel to connect elements such as thin film transistors and LEDs or the like, which are disposed on an upper surface of the display panel, and drivers such as gate drivers and data drivers or the like, which are disposed on a lower surface of the display panel. Specifically, by performing printing a plurality of times using a printing pad, side lines could be formed on a large-area display panel without limiting a size of the display panel. A technology of forming side lines using a printing pad as described above, is a method of printing side lines using a printing pad, after forming intaglio patterns etched in a metal plate mold, filling a conductive paste in the intaglio patterns, and after the filled conductive paste is applied on the printing pad, the side lines are printed using the printing pad. However, in performing an etching process using a photoresist to form the intaglio patterns, there was a problem in that a gap between the intaglio patterns may not be excessively narrowed due to a process margin of the etching process. In addition, when the gap between the intaglio patterns is reduced to several micrometers using a maximum margin, there could be a problem in which the conductive paste may not be properly filled in the intaglio patterns or the conductive paste may remain in the intaglio patterns. Accordingly, there was a problem in that a gap between the intaglio patterns for process stability, for example, to secure a gap of about 50 μm or more should be secured.

In addition, the number of light emitting elements that are disposed per unit area of a display device has increased as a need for a high resolution display panel. Accordingly, the number of lines for transmitting a signal to the light emitting elements has also increased. Accordingly, there occurred a problem in which whereas the number of lines to be disposed in a predetermined space increases, there is a limit in reducing an interval between side lines.

Accordingly, in the display device 100 according to an embodiment of the present disclosure, limitation of a design space may be alleviated by disposing the plurality of side lines 150 on different layers. For example, while six side lines per unit area are disposed in an existing display device, in the display device 100 according to an embodiment of the present disclosure, six side lines 150 can be additionally placed again on the six side lines 150. Thus, it is possible to increase the number of side lines 150 to be disposed per unit area while not reducing the interval between the side lines 150. Accordingly, there is no need to reduce a gap between intaglio patterns of a metal plate used to form the side lines 150, and the gap between the intaglio patterns can be sufficiently ensured, so that a problem in which a conductive paste is not properly filled in the intaglio patterns, or the conductive paste remains in the intaglio patterns can be resolved. Accordingly, in the display device 100 according to an embodiment of the present disclosure, process stability of a manufacturing process of the side lines 150 may be maintained.

In addition, in the display device 100 according to an embodiment of the present disclosure, the number of the side lines 150 to be disposed in a predetermined space may be increased by disposing the plurality of side lines 150 on different layers. Accordingly, in the display device 100 according to an embodiment of the present disclosure, the number of the side lines 150 that are disposed in a predetermined space and the number of the LEDs 130 that receive signals through the side lines 150 can be increased, so that the resolution of the display device 100 can be increased. Alternatively, if the resolution of the display device 100 is maintained equally, types of signals that are supplied to the LEDs 130 may be more diversified.

Figure 4:
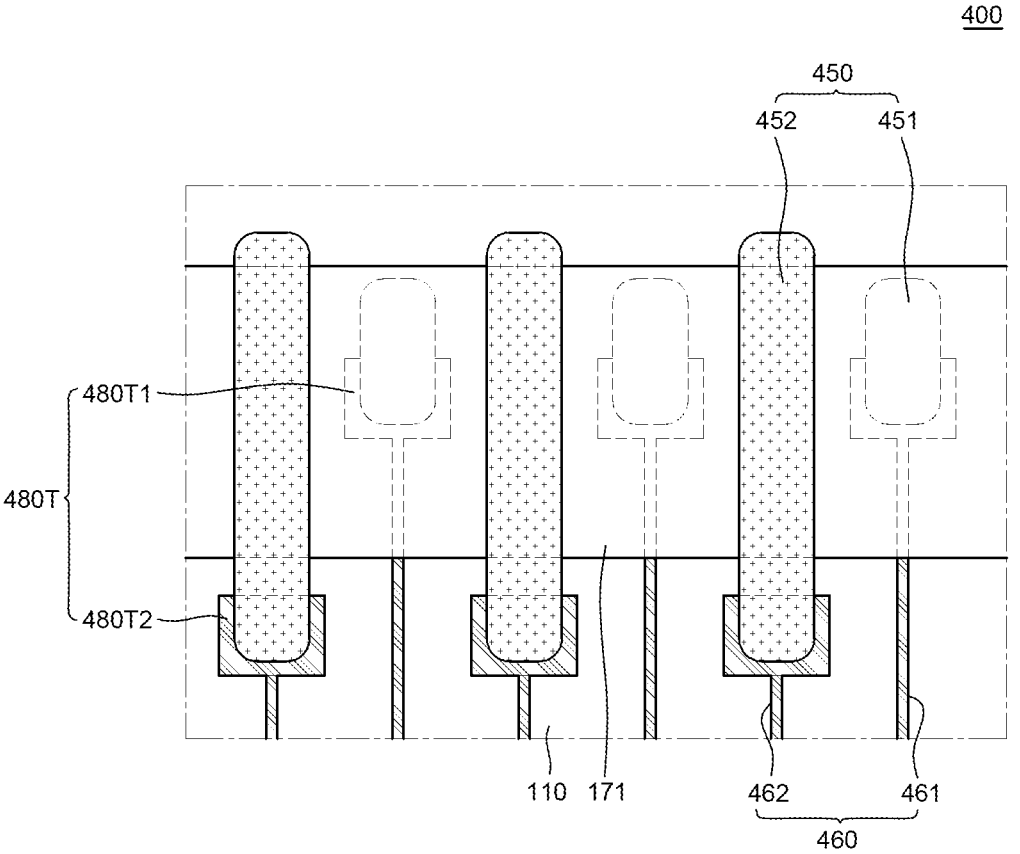
FIG. 4 is an enlarged plan view of a display device according to another embodiment of the present disclosure.

FIG. 4 is an enlarged plan view of a display device according to another embodiment of the present disclosure. Compared to the display device 100 described with reference to FIGS. 1 to 3, a display device 400 of FIG. 4 differs only in terms of upper pads 480T, lower pads, lines 460, link lines, and side lines 450 and other configurations thereof are substantially the same, and thus, a redundant description will be omitted.

The upper pads 480T include first upper pads 480T1 and second upper pads 480T2.

The first upper pad 480T1 may be disposed on an outer portion of the substrate 110. The first upper pad 480T1 may be connected to a first side line 451 through a contact hole formed in the first planarization layer 116.

The second upper pad 480T2 may be disposed on the same layer as the first upper pad 480T1. The second upper pad 480T2 may be disposed closer to the center of the substrate 110 than the first upper pad 480T1. That is, the second upper pad 480T2 may be disposed inwardly than the first upper pad 480T1. The second upper pad 480T2 may be connected to a second side line 452 through a contact hole. The second upper pad 480T2 may be formed of the same material as the first upper pad 480T1, but is not limited thereto.

The first upper pad 480T1 and the second upper pad 480T2 may be alternately disposed on the substrate 110. That is, the second upper pad 480T2 and the first upper pad 480T1 may be disposed in a zigzag shape.

The lines 460 are disposed on the substrate 110. The lines 460 includes first lines 461 and second lines 462. The first line 461 is a line connected to the first upper pad 480T1 of the upper pads 480T, and the second line 462 is a line connected to the second upper pad 480T2 of the upper pads 480T. The first line 461 and the second line 462 may be formed of the same material and disposed on the same layer, but are not limited thereto, and may be formed of different materials and disposed on different layers. Also, the first line 461 may be disposed between the second lines 462. That is, the first line 461 and the second line 462 may be alternately disposed on the substrate 110.

The lower pads include first lower pads and second lower pads.

The first lower pad may be disposed on the outer portion of the substrate 110. The first lower pad may be connected to the first side line 451 through a contact hole formed in the second planarization layer 117.

The second lower pad may be disposed on the same layer as the first lower pad. The second lower pad may be disposed closer to the center of the substrate 110 than the first lower pad. That is, the second lower pad may be disposed inwardly than first lower pad. The second lower pad may be connected to the second side line 452 through a contact hole. The second lower pad may be formed of the same material as the first lower pad, but is not limited thereto.

The first lower pad and the second lower pad may be alternately disposed on the lower surface of the substrate

110. That is, the second lower pad and the first lower pad may be disposed in a zigzag shape.

The link lines are disposed on the lower surface of the substrate 110.

The link lines include first link lines and second link lines.

The first link line is a line connected to the first lower pad of the lower pads, and the second link line is a line connected to the second lower pad of the lower pads. The first link line and the second link line may be formed of the same material and disposed on the same layer, but are not limited thereto, and they may be formed of different materials and disposed on different layers. Also, the first link line may be disposed between the second link lines. That is, the first link line and the second link line may be alternately disposed on the lower surface of the substrate 110.

The side lines 450 are disposed on the side surface of the substrate 110. The side lines 450 include the first side lines 451 and the second side lines 452.

The first side line 451 is disposed on the upper surface, the side surface, and the lower surface of the substrate 110. The first side line 451 may be disposed to be in contact with the first upper pad 480T1 through a contact hole formed in the first planarization layer 116. Also, the first side line 451 may be disposed to be in contact with the first lower pad through a contact hole formed in the second planarization layer 117. Accordingly, the first side line 451 may connect the first upper pad 480T1 and the first lower pad.

The second side line 452 is disposed on the first side line 451. The second side line 452 is disposed to surround the upper surface, the side surface, and the lower surface of the substrate 110. The second side line 452 may be disposed to be in contact with the second upper pad 480T2 through a contact hole formed in the first planarization layer 116. Also, the second side line 452 may be disposed to be in contact with the second lower pad through a contact hole formed in the second planarization layer 117. Accordingly, the second side line 452 may connect the second upper pad 480T2 and the second lower pad.

In this case, the second side line 452 may be disposed so as not to overlap the first side line 451. That is, the first side line 451 is disposed between the second side lines 452, so that the second side line 452 may overlap the second upper pad 480T2 and the second lower pad, and the first side line 451 may overlap the first upper pad 480T1 and the first lower pad.

In the display device 400 according to another embodiment of the present disclosure, an interval between the plurality of side lines 450 may be increased by disposing the plurality of side lines 450 on different layers. For example, while six side lines per unit area are disposed and all the six side lines are disposed on the same layer in an existing display device, in the display device 400 according to another embodiment of the present disclosure, a plurality of side lines 450 are disposed in a two-layer structure, three first side lines 451 among the six plurality of side lines 450 are disposed in a first layer, and the other three second side lines 452 are disposed in a second layer. Accordingly, an interval between the plurality of side lines 450 may be increased compared to a case in which all of the plurality of side lines 450 are disposed on one layer. Accordingly, in the display device 400 according to another embodiment of the present disclosure, a migration phenomenon that may occur in the plurality of side lines 450 may be suppressed by increasing the distance between the plurality of side lines 450 disposed adjacently, so that reliability of the display device 400 can be secured.

Figure 5:
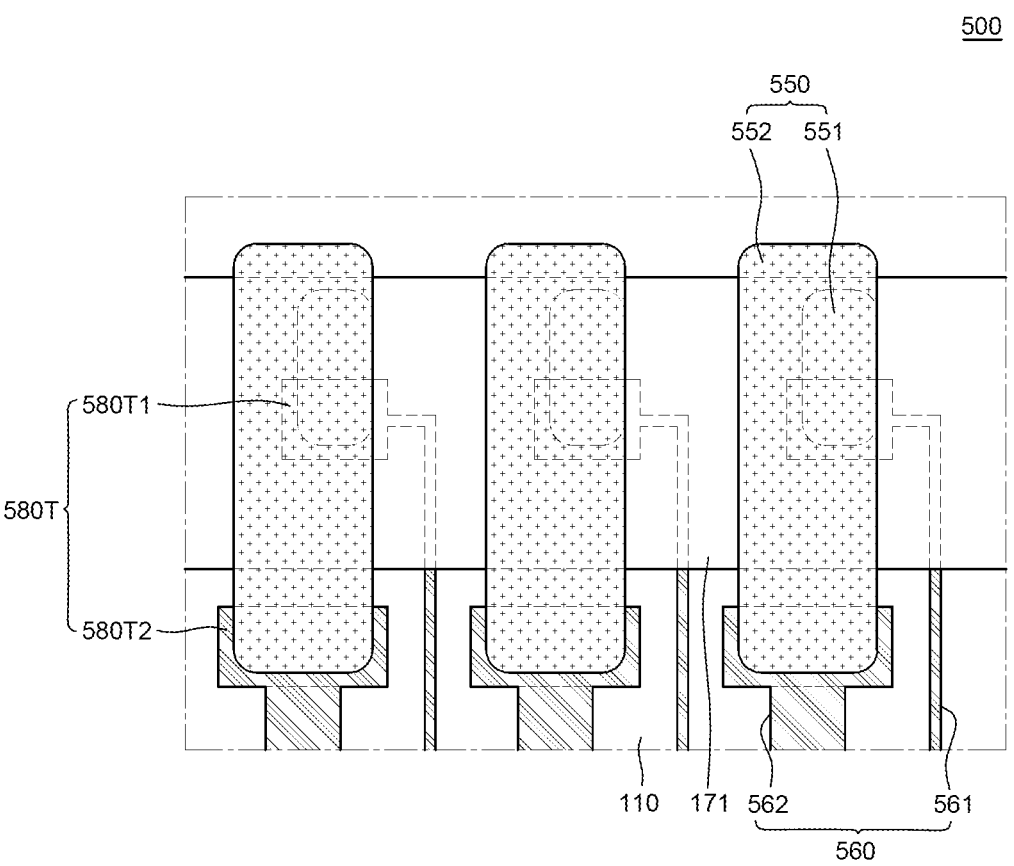
FIG. 5 is an enlarged plan view of a display device according to still another embodiment of the present disclosure.

FIG. 5 is an enlarged plan view of a display device according to still another embodiment of the present disclosure.

Compared to the display device 100 described with reference to FIGS. 1 to 3, a display device 500 of FIG. 5 differs only in terms of upper pads 580T, lower pads, lines 560, link lines, and side lines 550 and other configurations thereof are substantially the same, and thus, a redundant description will be omitted.

The upper pads 580T include first upper pads 580T1 and second upper pads 580T2.

The first upper pad 580T1 may be disposed on an outer portion of the substrate 110. The first upper pad 580T1 may be connected to a first side line 551 through a contact hole formed in the first planarization layer 116.

The second upper pad 580T2 may be disposed on the same layer as the first upper pad 580T1. The second upper pad 580T2 may be disposed closer to the center of the substrate 110 than the first upper pad 580T1. That is, the second upper pad 580T2 may be disposed inwardly than first upper pad 580T1. The second upper pad 580T2 may be connected to a second side line 552 through a contact hole. The second upper pad 580T2 may be formed of the same material as the first upper pad 580T1, but is not limited thereto.

The first upper pad 580T1 and the second upper pad 580T2 may be alternately disposed on the substrate 110. That is, the second upper pad 580T2 and the first upper pad 580T1 may be disposed in a zigzag shape.

In the display device 500 according to still another embodiment of the present disclosure, the first upper pad 580T1 and the second upper pad 580T2 may have different sizes. For example, a width of the second upper pad 580T2 may be greater than a width of the first upper pad 580T1.

Also, a separation distance of the second upper pads 580T2 may be different from a separation distance of the first upper pads 580T1. For example, the separation distance of the first upper pads 580T1 may be greater than the separation distance of the second upper pads 580T2.

The lines 560 are disposed on the substrate 110. The lines 560 include first lines 561 and second lines 562. The first line 561 is a line connected to the first upper pad 580T1 of the upper pads 580T, and the second line 562 is a line connected to the second upper pad 580T2 of the upper pads 580T. The first line 561 and the second line 562 may be formed of the same material and disposed on the same layer, but are not limited thereto, and they may be formed of different materials and disposed on different layers. Also, they may be disposed between the first line 561 and the second line 562.

The second line 562 may be a power supply line of the display device 500. For example, the second line 562 may be a power supply line such as a high potential power supply line, a low potential power supply line or the like.

In the display device 500 according to still another embodiment of the present disclosure, the first line 561 and the second line 562 may have different sizes. For example, a width of the second line 562 may be greater than a width of the first line 561, and may be twice or more the width of the first line 561. Also, a separation distance of the second lines 562 may be different from a separation distance of the first lines 561. For example, the separation distance of the first lines 561 may be greater than the separation distance of the second lines 562.

The lower pads include a first lower pad and a second lower pad.

The first lower pad may be disposed on the outer portion of the substrate 110. The first lower pad may be connected to the first side line 551 through a contact hole formed in the second planarization layer 117.

The second lower pad may be disposed on the same layer as the first lower pad. The second lower pad may be disposed closer to the center of the substrate 110 than the first lower pad. That is, the second lower pad may be disposed inwardly than first lower pad. The second lower pad may be connected to the second side line 552 through a contact hole. The second lower pad may be formed of the same material as the first lower pad, but is not limited thereto.

The first lower pad and the second lower pad may be alternately disposed on the substrate 110. That is, the second lower pad and the first lower pad may be disposed in a zigzag shape.

In the display device 500 according to still another embodiment of the present disclosure, the first lower pad and the second lower pad may have different sizes. For example, a width of the second lower pad may be greater than a width of the first lower pad. Also, a separation distance of the second lower pads may be different from a separation distance of the first lower pads. For example, the separation distance of the first lower pads may be greater than the separation distance of the second lower pads.

The link lines are disposed on the lower surface of the substrate 110.

The link lines include first link lines and second link lines.

The first link line is a line connected to the first lower pad of the lower pads, and the second link line is a line connected to the second lower pad of the lower pads. The first link line and the second link line may be formed of the same material and disposed on the same layer, but are not limited thereto, and they may be formed of different materials and disposed on different layers. Also, the first link line may be disposed between the second link lines.

The second link line may be connected to the second line 562 that is a power supply line through the side line 550 of the display device 500. Accordingly, the second link line may be a high potential power supply link line or a low potential power supply link line.

In the display device 500 according to still another embodiment of the present disclosure, the first link line and the second link line may be disposed in different sizes. For example, a width of the second link line may be greater than a width of the first link line, and may be twice or more the width of the first link line.

In addition, a separation distance of the second link lines may be different from a separation distance of the first link lines. For example, the separation distance of the first link lines may be greater than the separation distance of the second link lines.

The side lines 550 are disposed on the side surface of the substrate 110. The side lines 550 include the first side lines 551 and the second side lines 552.

The first side line 551 is disposed on the upper surface, the side surface, and the lower surface of the substrate 110. The first side line 551 may be disposed to be in contact with the first upper pad 580T1 through a contact hole formed in the first planarization layer 116. Also, the first side line 551 may be disposed to be in contact with the first lower pad through a contact hole formed in the second planarization layer 117. Accordingly, the first side line 551 may connect the first upper pad 580T1 and the first lower pad.

The second side line 552 is disposed on the first side line 551. The second side line 552 is disposed to surround the upper surface, the side surface, and the lower surface of the substrate 110. The second side line 552 may be disposed to be in contact with the second upper pad 580T2 through a contact hole formed in the first planarization layer 116. Also, the second side line 552 may be disposed to be in contact with the second lower pad through a contact hole formed in the second planarization layer 117. Accordingly, the second side line 552 may connect the second upper pad 580T2 and the second lower pad.

The second side line 552 may be connected to the second line 562 that is a power supply line of the display device 500 and the second link line that is a power supply link line.

In the display device 500 according to still another embodiment of the present disclosure, the first side line 551 and the second side line 552 may have different sizes. For example, a width of the second side line 552 may be greater than a width of the first side line 551.

In addition, a separation distance of the second side lines 552 may be different from the separation distance of the first side lines 551. For example, the separation distance of the first side lines 551 may be greater than the separation distance of the second side lines 552.

In the display device 500 according to still another embodiment of the present disclosure, a plurality of the upper pads 580T, a plurality of the lines 560 and a plurality of the side lines 550 that are disposed on the substrate 110 are disposed in different sizes, and thus, widths of the plurality of second side lines 552 and the plurality of lines 560 are expanded, so that a voltage drop that may occur in the display device 500 may be reduced or minimized. The display device 500 according to still another embodiment of the present disclosure includes the first side line 551 disposed on a first layer and the second side line 552 disposed on a second layer, and the width of the second side line 552 may be disposed to be greater than the width of the first side line 551. Accordingly, widths and cross-sectional areas of the plurality of second side lines 552 may be increased. For example, the widths of the plurality of second side lines 552 may be at least twice as large as widths of the plurality of first side lines 551. Accordingly, in the display device 500 according to still another embodiment of the present disclosure, resistances of the second side lines 552 and the second lines 562 that transmit power are reduced, so that a problem such as luminance deviation or the like due to a voltage drop of the display device 500 can be improved.

In addition, in the display device 500 according to still another embodiment of the present disclosure, the plurality of second side lines 552 are designed as low potential voltage lines, for example, lines that transmit a ground voltage, thereby protecting the first side line 551 and components of the display device 500 from external static electricity.

Figure 6:
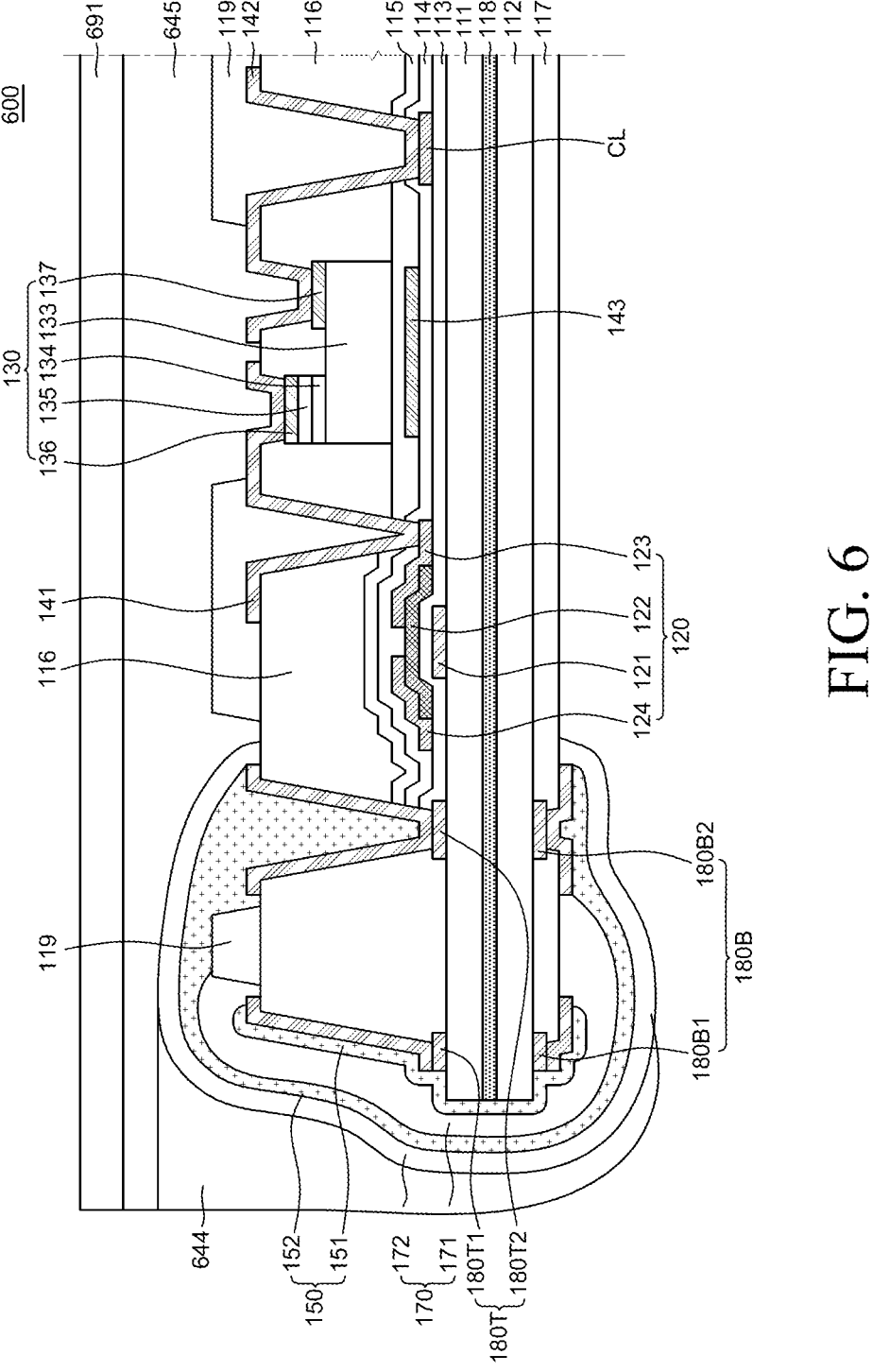
FIG. 6 is a cross-sectional view of a display device according to still another embodiment of the present disclosure.

FIG. 6 is a cross-sectional view of a display device according to still another embodiment of the present disclosure. Compared to the display device 100 described with reference to FIGS. 1 to 3, a display device 600 according to still another embodiment of the present disclosure differs only in terms of an addition of a sealing member 644 and a first cover layer 691, and other configurations thereof are substantially the same, and thus, a redundant description will be omitted.

Referring to FIG. 6, the first cover layer 691 is disposed on the second insulating layer 172 and the substrate 110. The first cover layer 691 may be disposed on the LED 130 and the sealing member 644 to thereby protect the display device 600 from external impacts. The first cover layer 691 may be formed of a glass or plastic material, but is not limited thereto. The first cover layer 691 may be a cover window or an anti-shattering film, but is not limited thereto.

A second bonding layer 645 may be disposed between the substrate 110 and the first cover layer 691. The second bonding layer 645 may be disposed on the substrate 110 and perform bonding between the substrate 110 and the first cover layer 691. The second bonding layer 645 may be formed of a material capable of bonding the substrate 110 and the first cover layer 691 by being cured through various curing methods. The second bonding layer 645 may be disposed in an entire area between the substrate 110 and the first cover layer 691 or may be disposed only in a partial area therebetween.

The sealing member 644 is disposed on the side surface of the substrate 110. The sealing member 644 is disposed to cover the second insulating layer 172. For example, the sealing member 644 may cover a portion of the second insulating layer 172 disposed on the upper surface of the substrate 110, the second insulating layer 172 disposed on the side surface of the substrate 110 and a portion of the second insulating layer 172 disposed on the lower surface of the substrate 110. Also, the sealing member 644 may be disposed to be in contact with the first cover layer 691.

The sealing member 644 may be formed of a material having elasticity. For example, the sealing member 644 may be formed of a material such as an acrylic resin or an epoxy resin, but is not limited thereto.

A side surface of the sealing member 644 may have a first surface that is positioned on the same plane as a side surface of the first cover layer 691. In addition, the sealing member 644 is disposed on the second insulating layer 172 disposed on the lower surface of the substrate 110 and may have a second surface extending from the first surface and having a different inclined shape.

Meanwhile, in the display device 600 according to still another embodiment of the present disclosure, after the sealing member 644 is formed on the second side line 152, a size of the display device 600 can be adjusted through a cutting process such as grinding or laser cutting. For example, after the first cover layer 691 is bonded using the second bonding layer 645, the sealing member 644 is applied to a side surface of the display device 600. Thereafter, the display device 600 may be manufactured by a method of removing a portion of the first cover layer 691 and a portion of the sealing member 644 through a cutting process such as grinding or laser cutting. Accordingly, the sealing member 644 disposed in a cut area may include a first surface that is positioned on the same plane as the side surface of the first cover layer 691 and a second surface having an inclined shape that is not disposed in the cut area.

In the display device 600 according to still another embodiment of the present disclosure, the first cover layer 691 is disposed on the upper surface of the substrate 110 and the sealing member 644 is disposed on the side surface of the substrate 110, so that the display device 600 can be protected from external impacts. The display device may be exposed to an external force in a process of transporting the display device, and thus the display device may be damaged. In addition, when a tiling display device is implemented using display devices, in order to prevent a viewer from seeing an interval between adjacent display devices, it is beneficial to reduce or minimize the interval between the adjacent display devices. Accordingly, even a minute error in a tiling process of the display device may cause contact with an adjacent display panel, and the display device may be damaged. In particular, when the non-display area is removed to implement a zero-bezel display device, protection of the side lines may become a problem. Accordingly, in the display device 600 according to still another embodiment of the present disclosure, the first cover layer 691 can protect the display device 600 from an impact occurring on the upper surface of the substrate 110, and the sealing member 644 can protect the side lines 150 and the side surface of the substrate 110 from an impact occurring on the side surface of the substrate 110.

In addition, in the display device 600 according to still another embodiment of the present disclosure, the side surface of the sealing member 644 and the side surface of the first cover layer 691 may be disposed on the same plane to thereby improve visibility of the display device 600. In general, side lines and an insulating layer of the display device are disposed on a surface inclined from a side surface of the substrate. For example, cross-sections of the side line and the insulating layer are in shape of curved surfaces like a shell structure and they are disposed to surround the side surface of the substrate. Accordingly, when display devices are tiled, for example, a 'V'-shaped groove is formed between the display devices. Accordingly, a 'V'-shaped groove is visible in the display device, thereby degrading the visibility of the display device. Accordingly, in the display device 600 according to still another embodiment of the present disclosure, the sealing member 644 is disposed on the side line 150 and the insulating layer 170, and the side surface of the sealing member 644 is disposed on the same plane as the side surface of the first cover layer 691, so that it is possible to prevent a 'V'-shaped groove from being visible in the display device 600.

Figure 7:
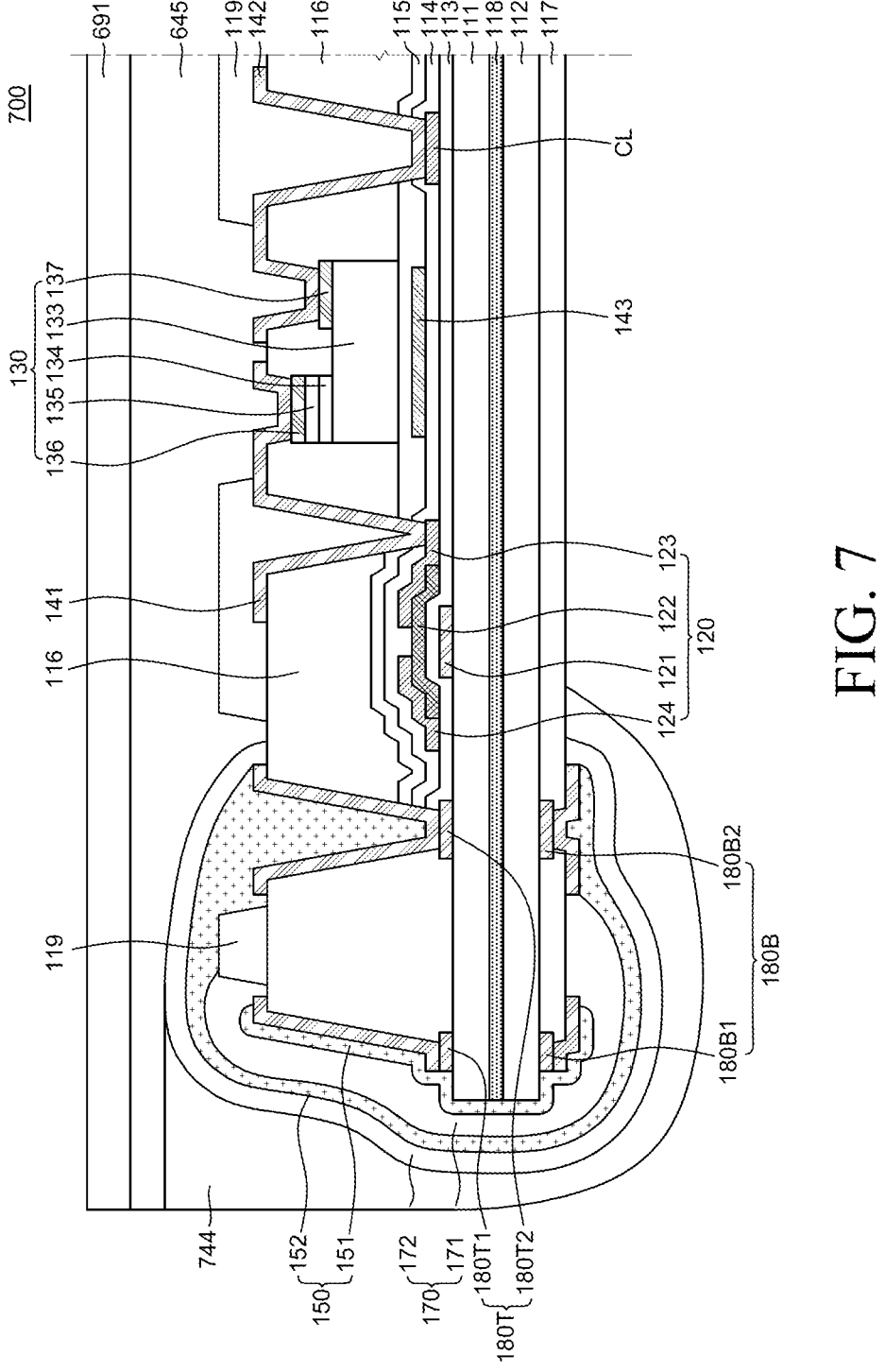
FIG. 7 is a cross-sectional view of a display device according to still another embodiment of the present disclosure.

FIG. 7 is a cross-sectional view of a display device according to still another embodiment of the present disclosure. Compared to the display device 600 described with reference to FIG. 6, a display device 700 according to still another embodiment of the present disclosure differs only in terms of a sealing member 744 and other configurations thereof are substantially the same, and thus, a redundant description will be omitted.

Referring to FIG. 7, the sealing member 744 is disposed on the side surface of the substrate 110. The sealing member 744 is disposed to cover the second side line 152, the second insulating layer 172, and the lower pad 180B. For example, the sealing member 744 may cover a portion of the second insulating layer 172 disposed on the upper surface of the substrate 110, the second insulating layer 172 disposed on the side surface of the substrate 110, and the second insulating layer 172 and the lower pad 180B disposed on the lower surface of the substrate 110. Accordingly, the sealing member 744 may cover the side surface of the substrate 110 on which the first cover layer 691 is not disposed and the lower surface of the substrate 110.

In the display device 700 according to still another embodiment of the present disclosure, the first cover layer 691 is disposed on the upper surface of the substrate 110 and the sealing member 744 is disposed on the side surface of the substrate 110, so that the first cover layer 691 can protect the display device 700 from impacts occurring on the upper surface of the substrate 110, and the sealing member 744 can protect the side lines 150 and the side surface of the substrate 110 from impacts occurring on the side surface of the substrate 110.

In addition, in the display device 700 according to still another embodiment of the present disclosure, the side surface of the sealing member 744 and the side surface of the first cover layer 691 are disposed on the same plane, so that it is possible to prevent a 'V'-shaped groove from being visible and improve visibility of the display device 700.

In addition, in the display device 700 according to still another embodiment of the present disclosure, the sealing member 744 is disposed to cover the second insulating layer 172 disposed on the lower surface of the substrate 110, so that the display device 700 may be protected from an impact occurring from the lower surface of the substrate 100. That is, in the display device 700 according to still another embodiment of the present disclosure, the sealing member 744 is disposed so that it is extended to cover both the second insulating layer 172 and the lower pad 180B that are disposed on the lower surface of the substrate 110. Accordingly, in the display device 700 according to still another embodiment of the present disclosure, the sealing member 744 may protect the side lines 150 and the lower pad 180B from an impact occurring on the lower surface of the substrate 110.

Figure 8:
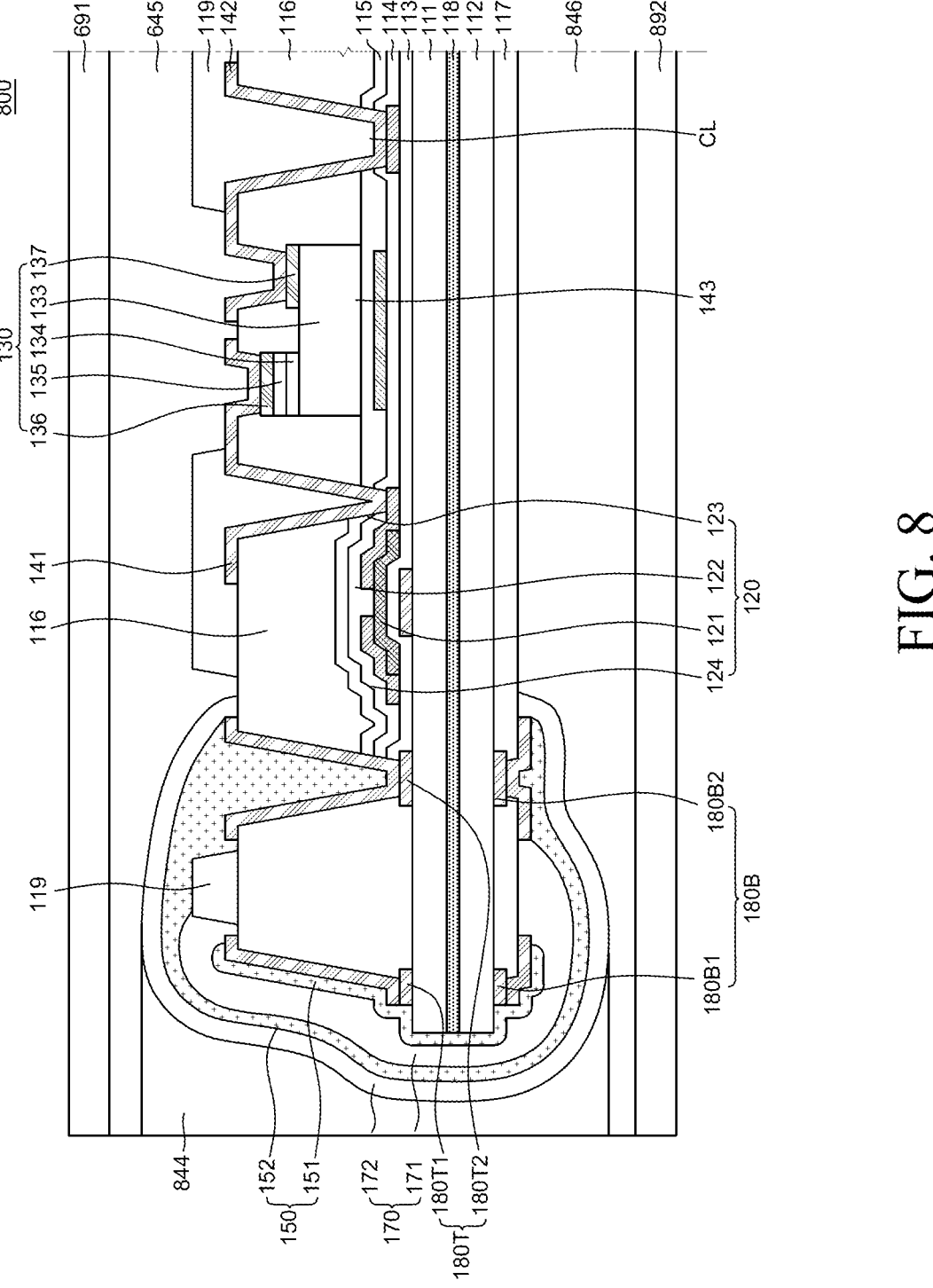
FIG. 8 is a cross-sectional view of a display device according to yet another embodiment of the present disclosure.

FIG. 8 is a cross-sectional view of a display device according to yet another embodiment of the present disclosure. Compared to the display device 600 described with reference to FIG. 6, a display device 800 according to yet another embodiment of the present disclosure differs only in that a sealing member 844 is different and a second cover layer 892 is added and other configurations thereof are substantially the same, and thus, a redundant description will be omitted.

Referring to FIG. 8, the second cover layer 892 is disposed under the substrate 110. The second cover layer 892 may be disposed under the substrate 110 and cover the second insulating layer 172 and the lower pad 180B. The display device 800 may be protected from external impacts. The second cover layer 892 may be formed of a glass or plastic material, but is not limited thereto. The second cover layer 892 may be a cover window or an anti-shattering film, but is not limited thereto.

Meanwhile, a third bonding layer 846 may be disposed between the substrate 110 and the second cover layer 892. The third bonding layer 846 may perform bonding between the substrate 110 and the second cover layer 892. The third bonding layer 846 may be formed of a material capable of bonding the substrate 110 and the second cover layer 892 by being cured through various curing methods. The third bonding layer 846 may be disposed in an entire area between the substrate 110 and the second cover layer 892, or may be disposed only in a partial area therebetween.

The sealing member 844 is disposed on the side surface of the substrate 110. The sealing member 844 is disposed to cover the second insulating layer 172. For example, the sealing member 844 may cover the first cover layer 691 and a portion of the second insulating layer 172 that are disposed on the upper surface of the substrate 110, the second insulating layer 172 disposed on the side surface of the substrate 110, and a portion of the second insulating layer 172 disposed on the lower surface of the substrate 110.

A side surface of the sealing member 844 may have a first surface that is positioned on the same plane as the side surface of the first cover layer 691 and a side surface of the second cover layer 892.

Meanwhile, in the display device 800 according to yet another embodiment of the present disclosure, after the sealing member 844 is formed on the second side line 152, a size of the display device 800 can be adjusted through a cutting process such as grinding or laser cutting. For example, after bonding the first cover layer 691 using the second bonding layer 645 and bonding the second cover layer 892 using the third bonding layer 846, the sealing member 844 is applied to a side surface of the display device 800. Thereafter, the display device 800 can be manufactured by a method of removing a portion of the first cover layer 691, a portion of the second cover layer 892, and a portion of the sealing member 844 through a cutting process such as grinding or laser cutting or the like. Accordingly, the sealing member 844 disposed in a cut area may include a first surface that is positioned on the same plane as the side surface of the first cover layer 691 and the side surface of the second cover layer 892.

In the display device 800 according to yet another embodiment of the present disclosure, the first cover layer 691 is disposed on the upper surface of the substrate 110 and the sealing member 844 is disposed on the side surface of the substrate 110, so that the first cover layer 691 can protect the display device 800 from impacts occurring on the upper surface of the substrate 110, and the sealing member 844 can protect the side lines 150 and the side surface of the substrate 110 from impacts occurring on the side surface of the substrate 110.

In addition, in the display device 800 according to yet another embodiment of the present disclosure, the side surface of the sealing member 844 and the side surface of the first cover layer 691 are disposed on the same plane, so that it is possible to prevent a 'V'-shaped groove from being visible and improve visibility of the display device 800.

In addition, in the display device 800 according to yet another embodiment of the present disclosure, the second cover layer 892 may be disposed to cover the second insulating layer 172 disposed on the lower surface of the substrate 110 and the substrate 110 to thereby protect the display device 800 from an impact occurring on the lower surface of the substrate 110.

In the display device 800 according to yet another embodiment of the present disclosure, the first cover layer 691 is disposed on the upper surface of the substrate 110 and the sealing member 844 is disposed on the side surface of the substrate 110, so that the first cover layer 691 can protect the display device 800 from impacts occurring on the upper surface of the substrate 110, and the sealing member 844 can protect the side lines 150 and the side surface of the substrate 110 from impacts occurring on the side surface of the substrate 110.

In addition, in the display device 800 according to yet another embodiment of the present disclosure, the side surface of the sealing member 844 and the side surface of the first cover layer 691 are disposed on the same plane, so that it is possible to prevent a 'V'-shaped groove from being visible and improve visibility of the display device 800.

In addition, in the display device 800 according to yet another embodiment of the present disclosure, the second cover layer 892 may be disposed on the lower surface of the substrate 110 to thereby protect the display device 800 from external impacts. That is, in the display device 800 according to yet another embodiment of the present disclosure, the second cover layer 892 is disposed to cover both the second insulating layer 172 and the lower pad 180B that are disposed on the lower surface of the substrate 110. Accordingly, in the display device 800 according to yet another embodiment of the present disclosure, the second cover layer 892 can protect the side lines 150 and the lower pad 180B from impacts occurring on the lower surface of the substrate 110.

The embodiments of the present disclosure can also be described as follows:

According to an aspect of the present disclosure, a display device comprises a substrate on which a plurality of light emitting elements are disposed; a plurality of lines disposed on an upper surface of the substrate; a plurality of link lines disposed on a lower surface of the substrate; and a plurality of side lines connecting the plurality of lines and the plurality of link lines, wherein the plurality of side lines include a plurality of first side lines and a plurality of second side lines, wherein the plurality of first side lines and the plurality of second side lines are disposed on different layers.

The display device may further comprise a first insulating layer covering the plurality of first side lines and disposed between the plurality of first side lines and the plurality of second side lines; a second insulating layer disposed to cover the plurality of second side line, the first insulating layer and the second insulating layer may include a black material.

The display device may further comprise a plurality of upper pads disposed on the upper surface of the substrate and connected to the plurality of lines; and a plurality of lower pads disposed on the lower surface of the substrate and connected to the plurality of link lines, the side lines are connected to the plurality of lines through the plurality of upper pads, the side lines are connected to the plurality of link lines through the plurality of lower pads, the plurality of upper pads includes a plurality of first upper pads connected to the plurality of first side lines and a plurality of second upper pads connected to the plurality of second side lines, the plurality of lower pads may include a plurality of first lower pads connected to the plurality of first side lines and a plurality of second lower pads connected to the plurality of second side lines.

The plurality of second upper pads are disposed closer to a center of the substrate than the plurality of first upper pads, and the plurality of second lower pads may be disposed closer to the center of the substrate than the plurality of first lower pads.

The plurality of second side lines may overlap the plurality of second upper pads and the plurality of second lower pads.

The plurality of first upper pads and the plurality of second upper pads are disposed in a zigzag shape, and the plurality of first lower pads and the plurality of second lower pads may be disposed in a zigzag shape.

The plurality of first upper pads and the plurality of second upper pads are disposed on the same layer, lines extending from the plurality of first upper pads and lines extending from the plurality of second upper pads among the plurality of lines may be disposed on the same layer.

A width of the plurality of second upper pads is greater than a width of the plurality of first upper pads, lines connected to the plurality of second upper pads among the plurality of lines may be power supply lines.

The display device may further comprise a sealing member covering the plurality of second side lines; and a first cover layer disposed on the substrate to be in contact with the sealing member.

A side surface of the sealing member may include a first surface positioned on the same plane as a side surface of the first cover layer and a second surface extending from the first surface and having an inclined shape.

The display device may further comprise a plurality of lower pads disposed on the lower surface of the substrate and connected to the plurality of link lines, the sealing member may be disposed to cover the plurality of lower pads.

The display device may further comprise a second cover layer disposed under the substrate and on a lower portion of the sealing member, a side surface of the first cover layer, a side surface of the sealing member, and a side surface of the second cover layer may be disposed on the same plane.

According to another aspect of the present disclosure, a display device comprises a substrate on which a plurality of light emitting elements are disposed; a plurality of first lines and a plurality of second lines disposed on an upper surface of the substrate; a plurality of first upper pads and a plurality of second upper pads disposed on the upper surface of the substrate and connected to the plurality of first lines and the plurality of second lines; a plurality of first link lines and a plurality of second link lines disposed on a lower surface of the substrate; a plurality of first lower pads and a plurality of second lower pads disposed on the lower surface of the substrate and connected to the plurality of first link lines and the plurality of second link lines; a plurality of first side lines connecting the plurality of first upper pads and the plurality of first lower pads; a first insulating layer disposed to cover the plurality of first side lines; and a plurality of second side lines connecting the plurality of second upper pads and the plurality of second lower pads and disposed on the first insulating layer.

At least a portion of the plurality of first side lines and at least a portion of the plurality of second side lines may overlap each other.

The plurality of first side lines may be disposed between the plurality of second side lines.

The plurality of first upper pads are disposed closer to an outer portion of the substrate than the plurality of second upper pads, and the plurality of first lower pads may be disposed closer to the outer portion of the substrate than the plurality of second lower pads.

The plurality of first upper pads and the plurality of second upper pads are alternately disposed on the substrate, and the plurality of first lower pads and the plurality of second lower pads may be alternately disposed on the substrate.

A width of the plurality of second side lines is greater than a width of the plurality of first side lines, and the plurality of second side lines may be connected to power supply lines.

The display device may further comprise a second insulating layer disposed to cover the plurality of second side lines; a sealing member disposed on the second insulating layer; and a first cover layer disposed on the plurality of light emitting elements and the sealing member.

The sealing member may cover the plurality of first lower pads and the plurality of second lower pads.

The display device may further comprise a second cover layer disposed under the plurality of first lower pads and the plurality of second lower pads and contacting the sealing member.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate having a plurality of pixels disposed thereon;
a plurality of light emitting elements disposed in each of the plurality of pixels;
a plurality of lines disposed on an upper surface of the substrate;
a plurality of link lines disposed on a lower surface of the substrate;
a plurality of side lines electrically connecting the plurality of lines and the plurality of link lines, and including a plurality of first side lines and a plurality of second side lines; and
a first insulating layer covering the plurality of first side lines and disposed between the plurality of first side lines and the plurality of second side lines,
wherein at least a portion of the plurality of first side lines and at least a portion of the plurality of second side lines overlap each other in a plan view,
wherein the plurality of light emitting elements include first LEDs and second LEDs,
wherein the first LEDs and the second LEDs are disposed in lines within each of the plurality of pixels,
wherein the first LEDs and the second LEDs are disposed adjacent to each other,
wherein the first LEDs are main LEDs and the second LEDs are redundancy LEDs,
wherein the light emitting elements emits at least two colors, and
wherein the main LEDs and the redundancy LEDs emit the same color.

2. The display device of claim 1, further comprising:
a second insulating layer disposed to cover the plurality of second side line,
wherein the first insulating layer and the second insulating layer include a black material.

3. The display device of claim 1, further comprising:
a plurality of upper pads disposed on the upper surface of the substrate and electrically connected to the plurality of lines; and
a plurality of lower pads disposed on the lower surface of the substrate and electrically connected to the plurality of link lines,
wherein the side lines are electrically connected to the plurality of lines through the plurality of upper pads,
wherein the side lines are electrically connected to the plurality of link lines through the plurality of lower pads,
wherein the plurality of upper pads includes a plurality of first upper pads electrically connected to the plurality of first side lines and a plurality of second upper pads electrically connected to the plurality of second side lines,
wherein the plurality of lower pads includes a plurality of first lower pads electrically connected to the plurality of first side lines and a plurality of second lower pads electrically connected to the plurality of second side lines.

4. The display device of claim 3, wherein the plurality of second upper pads are disposed closer to a center of the substrate than the plurality of first upper pads, and the plurality of second lower pads are disposed closer to the center of the substrate than the plurality of first lower pads.

5. The display device of claim 4, wherein the plurality of second side lines overlap the plurality of second upper pads and the plurality of second lower pads.

6. The display device of claim 4, wherein the plurality of first upper pads and the plurality of second upper pads are disposed in a zigzag shape, and the plurality of first lower pads and the plurality of second lower pads are disposed in a zigzag shape.

7. The display device of claim 3, wherein the plurality of first upper pads and the plurality of second upper pads are disposed on a same layer, wherein lines extending from the plurality of first upper pads and lines extending from the plurality of second upper pads among the plurality of lines are disposed on a same layer.

8. The display device of claim 3, wherein a width of each of the plurality of second upper pads is greater than a width of each of the plurality of first upper pads, wherein lines electrically connected to the plurality of second upper pads among the plurality of lines are power supply lines.

9. The display device of claim 1, further comprising:

a sealing member covering the plurality of second side lines; and a first cover layer disposed on the substrate and in contact with the sealing member.

10. The display device of claim 9, wherein a side surface of the sealing member includes a first surface positioned on a same plane as a side surface of the first cover layer and a second surface extending from the first surface and having an inclined shape.

11. The display device of claim 10, further comprising:

a plurality of lower pads disposed on the lower surface of the substrate and electrically connected to the plurality of link lines, wherein the sealing member covers the plurality of lower pads.

12. The display device of claim 9, further comprising:

a second cover layer disposed under the substrate and on a lower portion of the sealing member, wherein a side surface of the first cover layer, a side surface of the sealing member, and a side surface of the second cover layer are disposed on a same plane.

13. A display device, comprising:

a substrate having a plurality of pixels disposed thereon;

a plurality of light emitting elements disposed in each of the plurality of pixels;

a plurality of first lines and a plurality of second lines disposed on an upper surface of the substrate;

a plurality of first upper pads and a plurality of second upper pads disposed on the upper surface of the substrate and electrically connected to the plurality of first lines and the plurality of second lines;

a plurality of first link lines and a plurality of second link lines disposed on a lower surface of the substrate;

a plurality of first lower pads and a plurality of second lower pads disposed on the lower surface of the substrate and electrically connected to the plurality of first link lines and the plurality of second link lines;

a plurality of first side lines electrically connecting the plurality of first upper pads and the plurality of first lower pads;

a plurality of second side lines electrically connecting the plurality of second upper pads and the plurality of second lower pads; and a first insulating layer covering the plurality of first side lines and disposed between the plurality of first side lines and the plurality of second side lines, wherein the plurality of light emitting elements include first LEDs and second LEDs, wherein the first LEDs and the second LEDs are disposed in lines within each of the plurality of pixels, wherein the first LEDs and the second LEDs are disposed adjacent to each other, wherein the first LEDs are main LEDs and the second LEDs are redundancy LEDs, and wherein at least a portion of the plurality of first side lines and at least a portion of the plurality of second side lines overlap each other in a plan view, and wherein the plurality of light emitting elements emit at least two colors.

14. The display device of claim 13, wherein the plurality of first side lines are disposed between the plurality of second side lines.

15. The display device of claim 13, wherein the plurality of first upper pads are disposed closer to an outer portion of the substrate than the plurality of second upper pads, and the plurality of first lower pads are disposed closer to the outer portion of the substrate than the plurality of second lower pads.

16. The display device of claim 15, wherein the plurality of first upper pads and the plurality of second upper pads are alternately disposed on the substrate, and the plurality of first lower pads and the plurality of second lower pads are alternately disposed on the substrate.

17. The display device of claim 13, wherein a width of each of the plurality of second side lines is greater than a width of each of the plurality of first side lines, and the plurality of second side lines are electrically connected to power supply lines.

18. The display device of claim 13, further comprising:

a second insulating layer covering the plurality of second side lines;

a sealing member disposed on the second insulating layer; and a first cover layer disposed on the plurality of light emitting elements and the sealing member.

19. The display device of claim 18, wherein the sealing member covers the plurality of first lower pads and the plurality of second lower pads.

20. The display device of claim 18, further comprising:

a second cover layer disposed under the plurality of first lower pads and the plurality of second lower pads and contacting the sealing member.

21. The display device of claim 13, wherein the plurality of first lines, the plurality of second lines, the plurality of first upper pads and a plurality of second upper pads are formed of a same material and disposed on a same layer.

22. The display device of claim 21, wherein the plurality of first lines and the plurality of first upper pads are formed integrally, and the plurality of second lines and the plurality of second upper pads are formed integrally.

23. An electronic device, comprising:

a substrate having a plurality of pixels disposed thereon;

a plurality of light emitting elements disposed in each of the plurality of pixels;

a plurality of lines disposed on an upper surface of the substrate;

a plurality of link lines disposed on a lower surface of the substrate;

a plurality of side lines electrically connecting the plurality of lines and the plurality of link lines, the plurality of side lines including a plurality of first side lines and a plurality of second side lines; and a first insulating layer covering the plurality of first side lines and disposed between the plurality of first side lines and the plurality of second side lines, wherein at least a portion of the plurality of first side lines and at least a portion of the plurality of second side lines overlap each other in a plan view, wherein the plurality of light emitting elements include first LEDs and second LEDs, wherein the first LEDs and the second LEDs are disposed in lines within each of the plurality of pixels, wherein the first LEDs and the second LEDs are disposed adjacent to each other, wherein the first LEDs are main LEDs and the second LEDs are redundancy LEDs, wherein the plurality of light emitting elements emit at least two colors, and wherein the main LEDs and the redundancy LEDs emit the same color.

* * * * *